United States Patent
Fumitake

(10) Patent No.: US 8,598,001 B2
(45) Date of Patent: *Dec. 3, 2013

(54) METHOD FOR MANUFACTURING TWIN BIT STRUCTURE CELL WITH HAFNIUM OXIDE AND NANO-CRYSTALLINE SILICON LAYER

(75) Inventor: Mieno Fumitake, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 145 days.

This patent is subject to a terminal disclaimer.

(21) Appl. No.: 12/978,473

(22) Filed: Dec. 24, 2010

(65) Prior Publication Data

US 2011/0156129 A1 Jun. 30, 2011

(30) Foreign Application Priority Data

Dec. 29, 2009 (CN) .......................... 2009 1 0247494

(51) Int. Cl.
*H01L 21/336* (2006.01)

(52) U.S. Cl.
USPC .................... 438/287; 438/591; 257/E21.423

(58) Field of Classification Search
None
See application file for complete search history.

(56) References Cited

U.S. PATENT DOCUMENTS

| | | | |
|---|---|---|---|
| 5,658,822 A | 8/1997 | Wu et al. | |
| 5,661,592 A | 8/1997 | Bornstein et al. | |
| 6,018,178 A | 1/2000 | Sung | |
| 6,040,605 A | 3/2000 | Sano et al. | |
| 6,268,235 B1 | 7/2001 | Sakakura et al. | |
| 6,538,292 B2 | 3/2003 | Chang et al. | |
| 6,806,517 B2* | 10/2004 | Kim et al. ...................... | 257/204 |
| 6,835,621 B2 | 12/2004 | Yoo et al. | |
| 6,884,734 B2 | 4/2005 | Buehrer et al. | |
| 7,012,297 B2 | 3/2006 | Bhattacharyya | |
| 7,132,337 B2 | 11/2006 | Jakschik et al. | |
| 7,521,317 B2 | 4/2009 | Li et al. | |
| 7,589,368 B2 | 9/2009 | Lee | |

(Continued)

FOREIGN PATENT DOCUMENTS

CN 1883046 A 12/2006

OTHER PUBLICATIONS

Non-Final Office Action for U.S. Appl. No. 12/965,808, mailed on May 25, 2012, 13 pages.

(Continued)

*Primary Examiner* — Wensing Kuo

(74) *Attorney, Agent, or Firm* — Kilpatrick Townsend and Stockton LLP

(57) ABSTRACT

A method and system for forming a non-volatile memory structure. The method provides a semiconductor substrate and forms a gate dielectric layer overlying a surface region of the semiconductor substrate. A polysilicon gate structure is formed overlying the gate dielectric layer. The method subjects the polysilicon gate structure to an oxidizing environment to cause formation of a first silicon oxide layer overlying the polysilicon gate structure and formation of a second silicon oxide layer overlying a surface region of the substrate. A hafnium oxide material is formed overlying the first and second silicon oxide layers and filling the undercut region. The hafnium oxide material has a nanocrystalline silicon material sandwiched between a first hafnium oxide layer and a second hafnium oxide layer. The hafnium oxide material is selectively etched while a portion of it is maintained in an insert region in a portion of the undercut region.

19 Claims, 9 Drawing Sheets

(56) References Cited

U.S. PATENT DOCUMENTS

| | | | |
|---|---|---|---|
| 7,666,739 | B2 | 2/2010 | Lee et al. |
| 7,723,789 | B2 | 5/2010 | Lin et al. |
| 7,732,281 | B1 | 6/2010 | Shen et al. |
| 7,851,285 | B2 | 12/2010 | Park |
| 7,915,123 | B1 | 3/2011 | Lee et al. |
| 8,114,732 | B2 * | 2/2012 | Fumitake ............. 438/239 |
| 2004/0021172 | A1 | 2/2004 | Zheng et al. |
| 2004/0142528 | A1 | 7/2004 | Bhattacharyya |
| 2004/0183106 | A1 | 9/2004 | Kim et al. |
| 2006/0001075 | A1 | 1/2006 | Shih |
| 2006/0046403 | A1 | 3/2006 | Chu et al. |
| 2006/0134871 | A1 | 6/2006 | Jakschik et al. |
| 2007/0134914 | A1 | 6/2007 | Cheong et al. |
| 2008/0017954 | A1 | 1/2008 | Suzuki et al. |
| 2008/0049517 | A1 | 2/2008 | Hung et al. |
| 2008/0061359 | A1 | 3/2008 | Lee et al. |
| 2008/0153222 | A1 | 6/2008 | Lee et al. |
| 2008/0182377 | A1 | 7/2008 | Rao et al. |
| 2008/0213963 | A1 | 9/2008 | Shih |
| 2008/0315290 | A1 | 12/2008 | Lee et al. |
| 2009/0032864 | A1 | 2/2009 | Inoue |
| 2009/0096014 | A1 * | 4/2009 | Choi et al. ............. 257/324 |
| 2009/0115318 | A1 | 5/2009 | Gregory et al. |

OTHER PUBLICATIONS

Requirement for Restriction/Election for U.S. Appl. No. 12/968,264, mailed on May 23, 2012, 7 pages.
Final Office Action for U.S. Appl. No. 12/704,502, mailed on Apr. 4, 2011, 12 pages.
Non-Final Office Action for U.S. Appl. No. 12/704,502, mailed on Nov. 26, 2010, 10 pages.
Final Office Action for U.S. Appl. No. 12/704,502, mailed on Jun. 10, 2011, 13 pages.
Notice of Allowance for U.S. Appl No. 12/704,502, mailed on Oct. 11, 2011, 7 pages.
Non-Final Office Action for U.S. Appl. No. 12/969,563, mailed on Apr. 26, 2012, 22 pages.
Non-Final Office Action for U.S. Appl. No. 12/968,264, mailed on Jul. 10, 2012, 12 pages.
Final Office Action for U.S. Appl. No. 12/978,346, mailed on Jul. 20, 2012, 12 pages.
Final Office Action for U.S. Appl. No. 12/969,563, mailed on Aug. 16, 2012, 15 pages.
Non-Final Office Action for U.S. Appl. No. 12/978,346, mailed on Oct. 7, 2011, 13 pages.
Non-Final Office Action for U.S. Appl. No. 12/704,502, mailed on Nov. 26, 2010, 11 pages.
Final Office Action for U.S. Appl. No. 12/965,808, mailed on Dec. 28, 2012, 17 pages.
Final Office Action for U.S. Appl. No. 12/968,264, mailed on Dec. 28, 2012, 14 pages.
Non-Final Office Action for U.S. Appl. No. 12/969,563, mailed on Feb. 4, 2013, 15 pages.
Non-Final Office Action for U.S. Appl. No. 12/968,264, mailed Jun. 19, 2013, 13 pages.
Final Office Action for U.S. Appl. No. 12/969,563, mailed Jul. 16, 2013, 20 pages.
Non-Final Office Action for U.S. Appl. No. 12/978,346, mailed Aug. 27, 2013, 17 pages.
Notice of Allowance for U.S. Appl. No. 12/965,808, mailed Sep. 6, 2013, 2 pages.

* cited by examiner

Retention characteristics of HfOx/nano-crystalline Si layer.
Vg=Vd=Vs=Vb=0

METHOD FOR MANUFACTURING TWIN BIT STRUCTURE CELL WITH HAFNIUM OXIDE AND NANO-CRYSTALLINE SILICON LAYER

CROSS-REFERENCES TO RELATED APPLICATIONS

This application claims priority to Chinese Application No. 200910247494.2 filed on Dec. 29, 2009, commonly assigned and is hereby incorporated by reference for all purposes. This application is also related to the following co-pending U.S. patent applications, all of which are commonly owned and are hereby incorporated by reference for all purposes, U.S. patent application Ser. No. 12/704,502, filed Feb. 11, 2010, U.S. patent application Ser. No. 12/978,346, filed Dec. 23, 2010, U.S. patent application Ser. No. 12/965,808, filed Dec. 10, 2010, U.S. patent application Ser. No. 12/968,264, filed Dec. 14, 2010, and U.S. patent application Ser. No. 12/969,563, filed Dec. 15, 2010.

BACKGROUND OF THE INVENTION

Embodiments of the present invention relate to integrated circuits and the processing for the manufacture of semiconductor devices. More particularly, embodiments of the invention provide a method and a device for forming a twin bit cell structure for semiconductor integrated circuit devices, but it would be recognized that the invention has a much broader range of applicability. In a specific embodiment, the present invention provides a method for manufacturing a twin-bit structure cell with a hafnium oxide layer and a nano-crystalline silicon layer that are used together for storing charges.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but also has provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in the fabrication of integrated circuits has a limit. That is to say, a given process typically only works down to a certain feature size, and then either the process or the device layout or both needs to be changed. An example of such limitation lies in the manufacturing of memory devices. As the feature size continues to shrink, a twin bit cell structure will become more difficult to design and manufacture as it is difficult to control the gates independently.

One of the challenges in the semiconductor processing has been the manufacturing of twin-bit cell structures for non-volatile memory devices, such as the widely used flash based memory devices. Among other things, the conventional system and method for manufacturing cells with twin-bit structures face limitations when further scaling down of the cell size is required.

From the above, it is seen that improved techniques and improved material designs for the manufacturing of twin bit cell structures for non-volatile memory devices are desired.

BRIEF SUMMARY OF THE INVENTION

Embodiments of the present invention provide innovative techniques of manufacturing memory devices. More particularly, embodiments according to the present invention provide a method and a design for manufacturing a twin bit cell structure for a non-volatile memory device. But it should be recognized that the present invention has a much broader range of applicability.

A specific embodiment of the present invention provides a method for forming a non-volatile memory structure. The method includes providing a semiconductor substrate including a surface region and forming a gate dielectric layer overlying the surface region. The method further includes forming a polysilicon gate structure overlying the gate dielectric layer. In a specific embodiment, the method subjects the polysilicon gate structure to an oxidizing environment to cause the formation of a first silicon oxide layer overlying the polysilicon gate structure. Preferably, an undercut region is formed underneath the gate polysilicon structure. The method includes forming a hafnium oxide material overlying the polysilicon gate structure including the undercut region and the gate dielectric layer. In a specific embodiment, the hafnium oxide material comprises a nanocrystalline silicon material sandwiched between a first hafnium oxide layer and a second hafnium oxide layer. The hafnium oxide material is subjected to a selective etching process to form an insert region in a portion of the undercut region while the insert region remains filled with the hafnium oxide material.

Another embodiment of the present invention provides a non-volatile memory device. In an embodiment, the non-volatile memory device includes a semiconductor substrate including a surface region, a gate dielectric layer overlying the surface region and a polysilicon gate structure overlying the gate dielectric layer. The non-volatile memory device also includes a first undercut region and a second undercut region underneath the polysilicon gate structure in a portion on each side of the gate dielectric layer. The non-volatile memory device further includes a first silicon oxide layer covering a peripheral surface of the polysilicon gate structure including surface areas facing the undercut regions. Additionally, the non-volatile memory device includes a hafnium oxide material in an insert region in a portion of each of the first and second undercut regions. In an embodiment, the hafnium oxide material includes a nanocrystalline silicon material sandwiched between a first hafnium oxide layer and a second hafnium oxide layer. Furthermore, a sidewall structure overlies a side region of the polysilicon gate structure and a side region of the hafnium oxide material.

Embodiments of the present invention can provide many benefits over conventional techniques. For example, embodiments of the present invention provide a method to form a reliable twin bit cell structure. According to a specific embodiment, a gate structure is formed on top of a dielectric layer, which is later selectively etched to form undercut regions. The undercut regions are used to accommodate a conductive material such as a hafnium oxide material within the embedded nano-crystalline silicon layer. In an example embodiment, the conductive material is used to hold charges for storing information data (i.e., bits). It is to be appreciated that because embodiments of the present invention provide undercut regions, various etching processes used in the present invention are self-aligned. Embodiments of the present invention provide innovative techniques for forming twin-bit cell structures and allow further scaling down of memory devices comparing with convention techniques. Various processes and techniques used in the present invention can be compatible with conventional systems and equipments, so that a cost effective implementation of further scaled down memory devices can be achieved. There are other benefits as well.

Various additional embodiments, features and advantages of the present invention can be more fully appreciated with reference to the detailed description and accompanying drawings that follow.

BRIEF DESCRIPTION OF THE DRAWINGS

The accompanying drawings, which are incorporated herein and form a part of the specification, illustrate the present invention and, together with the description, further serve to explain embodiments of the invention.

DETAILED DESCRIPTION OF THE INVENTION

Embodiments of the present invention provide techniques for manufacturing non-volatile memory devices. Merely by way of example, embodiments according to the present invention provide a method and a design for manufacturing a twin bit cell structure of a non-volatile memory device. But embodiments according to the present invention can also be applied to manufacturing of other devices.

Figure 1:
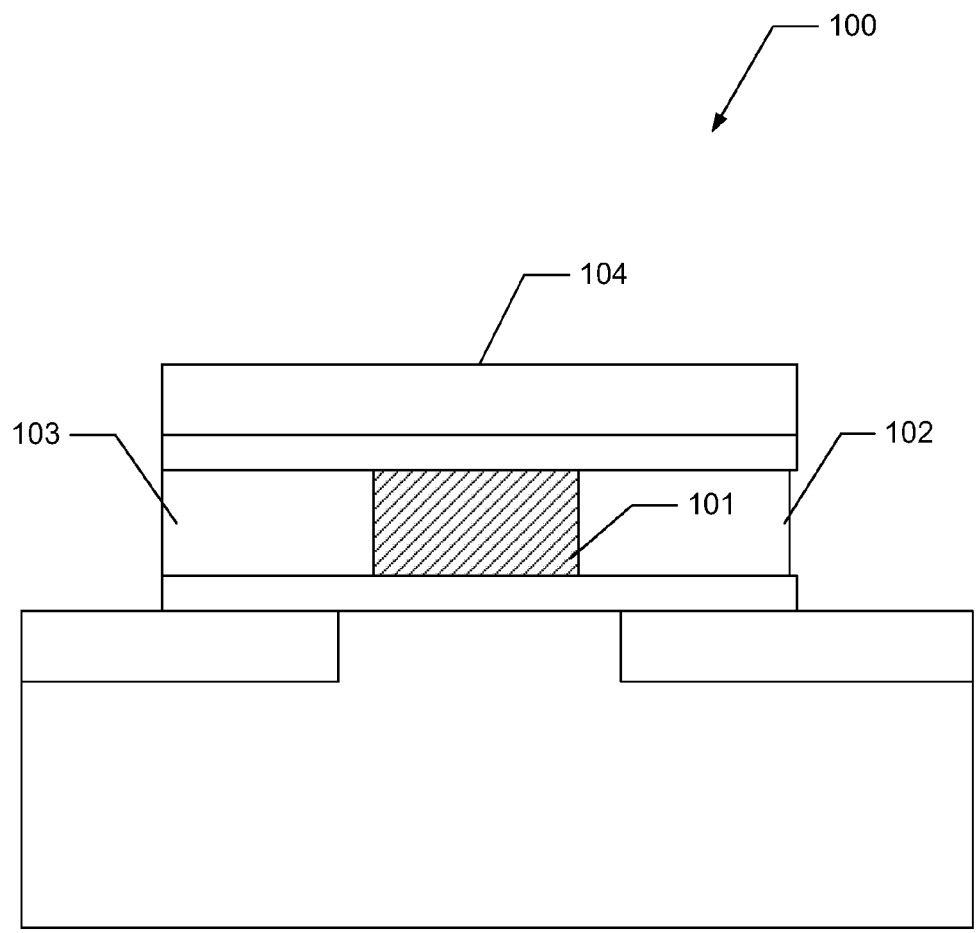
FIG. 1 is a simplified cross-sectional view illustrating a conventional method of forming a gate structure for a non-volatile memory device.

FIG. 1 is a simplified twin bit cell structure using a conventional method of fabrication. As shown in FIG. 1, the twin-bit structure 100 has two conductive regions 102 and 103 that can be configured to hold charges. The two conductive regions are separated by an isolation region 101. A control gate 104 overlays the conductive regions.

As an example, the twin bit cell structure shown in FIG. 1 is manufactured using the following steps:
  1. provide a p-type substrate;
  2. form a gate oxide layer overlaying the substrate;
  3. form an n-type doped polysilicon layer;
  4. form an HTO (high temperature oxide) layer;
  5. form an undoped polysilicon layer;
  6. form an HTO layer; and
  7. form a layer of n-type doped polysilicon.

Among other things, the conventional manufacturing processes, such as the one outlined above, are difficult to achieve small scale. For example, the formation of an insulating region between the conducting layers (e.g., as provided by the n-type doped regions) is performed by an etching process that can only be scaled down so much. In addition, the use of multiple HTO processes imposes a limitation on the total available thermal budget.

Therefore, it is to be appreciated that various manufacturing processes and structures as provided by the embodiments of the present invention made it possible to scale down the size of twin-bit cell structures as compared with conventional techniques. An exemplary process is described in detail below.

Figure 2:
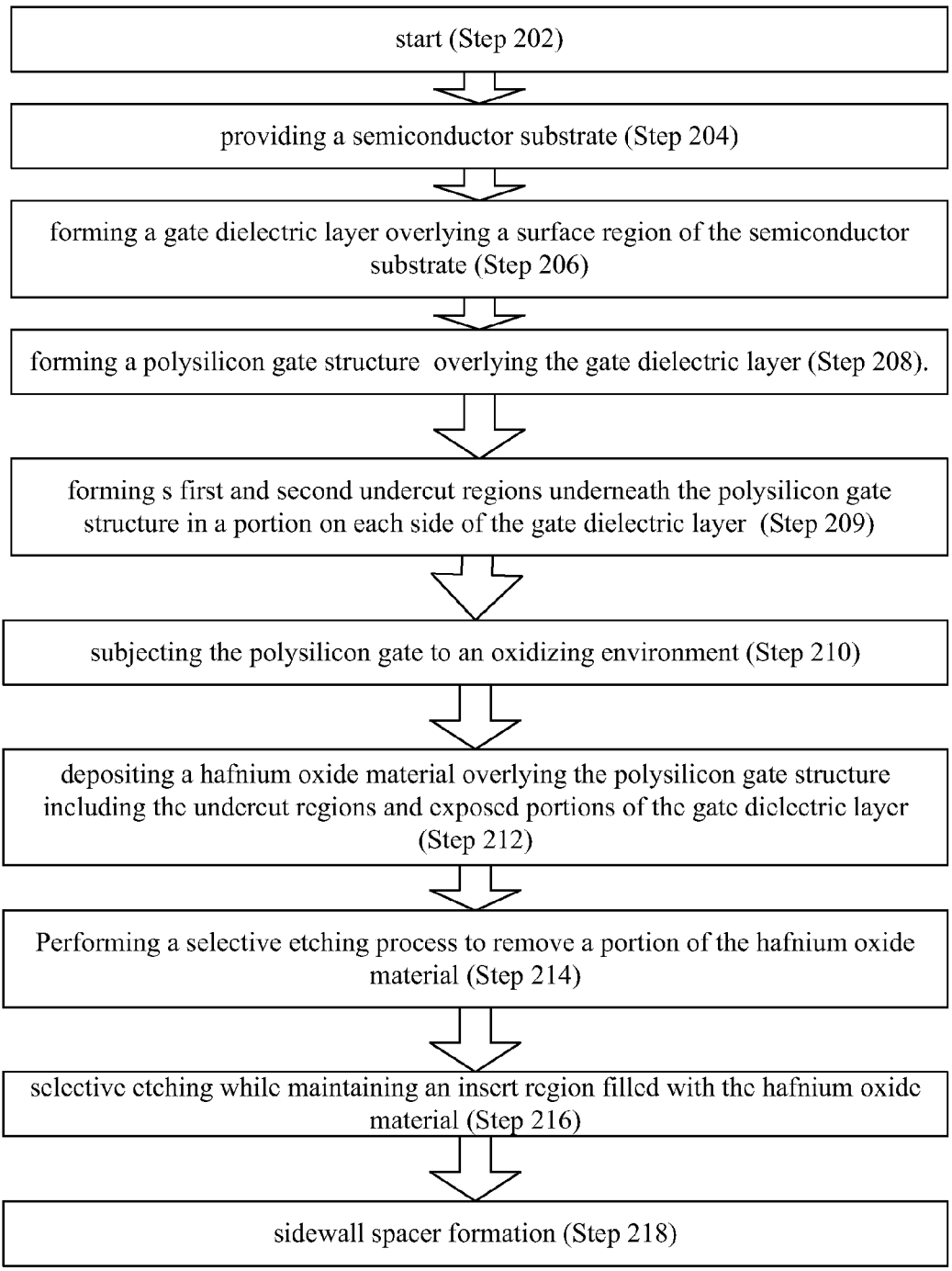
FIG. 2 is a simplified flow diagram illustrating a method of forming a gate structure for a non-volatile memory device according to an embodiment of the present invention.

FIG. 2 is a simplified flow diagram illustrating a method of forming a twin cell structure according to an embodiment of the present invention. This diagram is merely an example and should not unduly limit the claims herein. One skilled in the art would recognized other variations, modifications, and alternatives. As an example, various steps described in FIG. 2 can be added, removed, modified, replaced, repeated, rearranged, and/or overlapped.

As shown, the method begins at Step 202. The method includes providing a semiconductor substrate (Step 204). In a specific embodiment, the semiconductor substrate can be a single crystal silicon doped with a P-type impurity in a specific embodiment. Alternatively, the semiconductor substrate can be a silicon on insulator substrate, commonly known as SOI. In another embodiment, the semiconductor substrate can also be a silicon germanium wafer or others.

The method includes forming a gate dielectric layer overlying a surface region of the semiconductor substrate (Step 206). Depending on the application, the gate dielectric layer can be formed in various ways, such as silicon oxide that is deposited using a suitable technique, for example, a thermal growth process. In a specific embodiment, a high temperature oxidation process is used to form a silicon oxide layer of less than 250 angstroms in thickness, which can be used as the gate dielectric layer.

The method further includes forming a polysilicon gate structure overlying the gate dielectric layer (Step 208). As an example, the polysilicon gate structure is formed by using a deposition process of a doped polysilicon material followed by a patterning and etch process. In a specific embodiment, an LPCVD process is used to form the polysilicon gate layer having a thickness less than 1000 angstroms. In an exemplary embodiment, silane may be used to perform LPCVD as a reactant gas.

In Step 209, a first and second undercut regions are formed underneath the polysilicon gate structure in a portion on each side of the gate dielectric layer. In a specific embodiment, this step can be carried out by subjecting the device structure to an isotropic dielectric etching process. In an example embodiment, a wet HF etching process can be used. In another example embodiment, an isotropic dry dielectric etching process can be used.

As shown in FIG. 2, the method includes subjecting the polysilicon gate to an oxidizing environment (Step 210). In a specific embodiment, the oxidizing environment causes a silicon oxide layer to form overlying a peripheral surface of the polysilicon gate structure including the underside facing the undercut regions in the gate dielectric layer. The oxidizing environment also causes a second oxide layer to form overlying a surface region of the semiconductor substrate facing the undercut regions.

The method then deposits a hafnium oxide material overlying the polysilicon gate structure including the undercut regions and exposed portions of the gate dielectric layer (Step 212). In a specific embodiment, the hafnium oxide material includes a nanocrystalline silicon material sandwiched within hafnium oxide layers.

The method performs a selective etching process to remove a portion the hafnium oxide material (Step 214). In a preferred embodiment, the selective etching process maintains an insert region on each side of the gate dielectric layer, wherein the insert region is filled with the hafnium oxide material (Step 216). In an exemplary embodiment, the gate dielectric layer determines the thickness of the hafnium oxide material.

The method performs other processes to complete the cell structure. These other processes can include sidewall spacer formation (Step 218), among others. The method also includes performing other steps to complete the memory device. Of course there can be other modifications, variations, and alternatives.

FIGS. 3-11 are simplified cross-sectional diagrams illustrating a method for forming a twin bit cell structure for a memory device according to an embodiment of the present invention. These diagrams are merely examples and should not unduly limit the claims herein. One skilled in the art would recognized other variations, modifications, and alternatives. It is to be appreciated various steps as illustrated in these figures can be performed in various sequences, repeated, modified, rearranged, and/or overlapped.

Figure 3:
FIG. 3-11 are simplified cross-sectional diagrams illustrating a method of forming a gate structure for a non-volatile memory device according to an embodiment of the present invention.

As shown in FIG. 3, the method provides a semiconductor substrate 302. The semiconductor substrate can be a single crystal silicon substrate doped with a P-type impurity in a specific embodiment. Alternatively, the semiconductor substrate can be a silicon on insulator substrate, commonly known as SOI. The semiconductor substrate can also be a silicon germanium wafer or others, depending on the embodiment. As shown, the semiconductor substrate includes a surface region 304.

Figure 4:
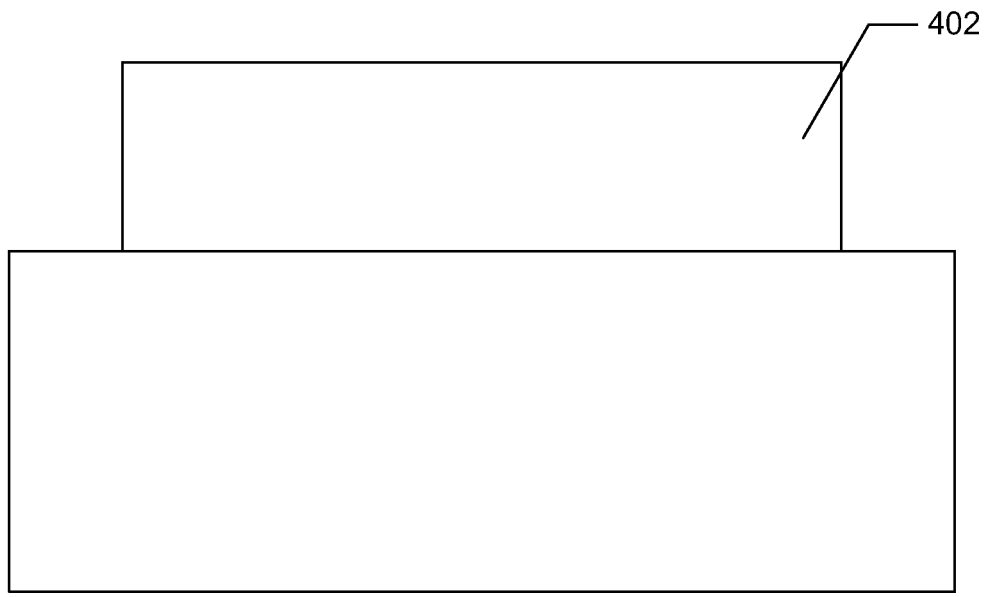

In a specific embodiment, the method includes forming a gate dielectric layer 402 overlying the surface region of the semiconductor substrate as shown in FIG. 4. The gate dielectric layer can be a high density silicon oxide layer formed by a thermal growth process. The gate dielectric layer can also be a composite dielectric stack, for example, silicon oxide on silicon nitride on silicon oxide stack, commonly known as ONO. Other dielectric materials such as silicon nitride, silicon oxynitride, may also be used, depending on the embodiment. Taking a thermally grown oxide as the gate dielectric layer as an example, the gate dielectric can have a thickness ranging from about 20 Angstroms to about 1000 Angstroms. In a specific embodiment, high temperature oxidation process is used to form the gate dielectric layer 402 consisting mostly silicon oxide, the dielectric layer 402 having a thickness of between 50 to 1000 angstroms. Of course there can be other variations, modifications, and alternatives.

Figure 5:
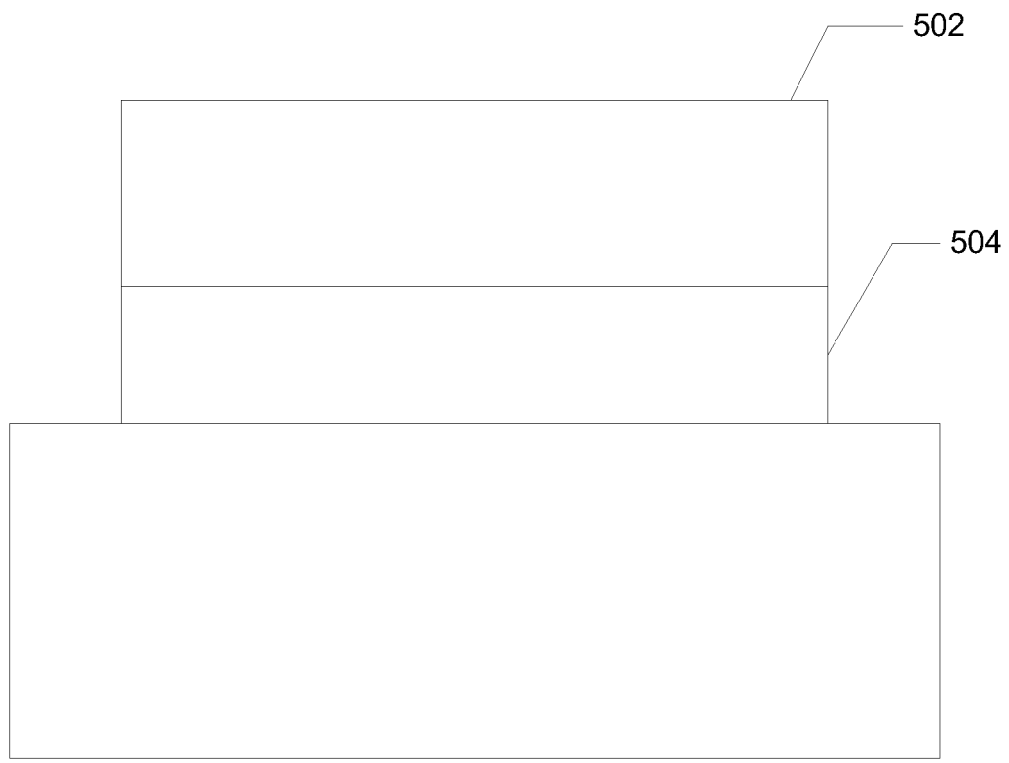

Referring to FIG. 5, the method includes forming a gate structure 502 overlying the gate dielectric layer 504. In a specific embodiment, the gate structure can be a polysilicon gate structure. The polysilicon gate structure can be formed by a deposition of a polysilicon material followed by a patterning and etching process. For example, an LPCVD process is used to form the polysillicon gate structure. The polysilicon material may be doped with suitable impurities to provide for a desirable property. In a specific embodiment, the polysilicon material is doped with N-type impurities such as arsenic, phosphorus, or antimony, but can be others. For example, the doping concentration of the N-type impurities is approximately between $1.0\,E18$ and $1.0\,E22$ atoms/cm$^3$. Depending on the specific applications, the gate structure 502 may have a thickness ranging from about 300 angstroms to about 5,000 angstroms.

Figure 6:
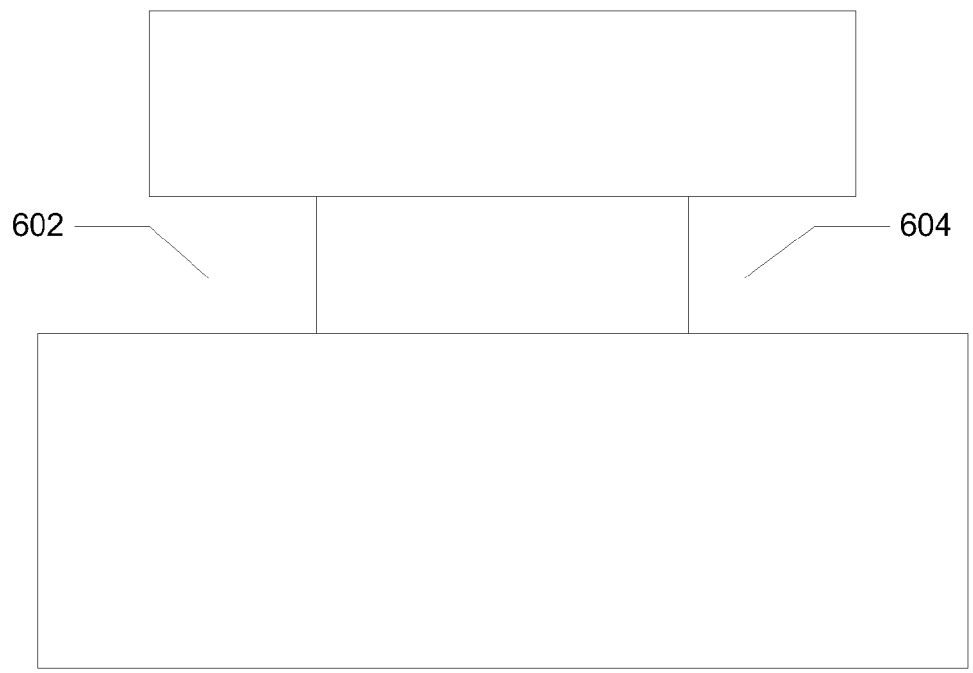

In a specific embodiment, the method forms a first undercut region 602 and a second undercut region 604 in a portion of each side of the gate dielectric layer as shown in FIG. 6. The undercut regions can be formed using a self-limiting etching process in a specific embodiment. For example, the size of the undercut region depends at least on the thickness of the gate dielectric layer. In a specific embodiment, a selective etching process is performed to partially remove the gate dielectric layer, which may comprise a silicon oxide material. In an example embodiment, the selectivity of the etching process is afforded by the layers that surround the gate dielectric layer that is to be etched away (e.g., the polysilicon gate structure and the semiconductor substrate together provide the alignment for the etching). The undercut region is a void region as defined by the gate dielectric thickness in a specific embodiment, as shown. It is to be appreciated that using the self-limiting etching process as described above, there is no need to use a photoresist. Thus, embodiment of the present invention enable a further down-scaling compared with conventional processes.

Referring to FIG. 6, the etching process can be a wet dielectric etch process, e.g., an HF solution for etching silicon oxide. Alternatively, an isotropic dry etch process suitable for etching the gate dielectric layer can be used. In a specific embodiment, the thin gate dielectric layer limits the transport of etchant chemicals and etch residues, thereby causing the etch process to be substantially self-limiting. The self-aligned etch process does not require a lithographic process or photoresist. As a result, the device dimension is not subject to the limitations of the lithographic patterning process. In an example embodiment, the width of the remaining gate dielectric layer can be smaller than the minimum geometry allowed in the lithographic process. Furthermore, the width of the undercut region can also be made to be smaller than the minimum geometry. As a specific embodiment, the width of the gate dielectric can be that is allowed by the minimum geometry, and the undercut regions and the remaining gate dielectric layer can all be smaller than the minimum geometry. In an embodiment, the width of the remaining gate dielectric layer ranges from about 200 angstroms to 1000 angstroms. In an embodiment, the height of the undercut regions is equal to the thickness of the gate dielectric layer. In an embodiment, the height of the undercut regions ranges from 50 angstroms to about 1000 angstroms. In another embodiment, the width of the undercut regions ranges from 150 angstroms to 600 angstroms. Therefore, a minimum geometry twin-bit memory cell can be formed using this method, enabling a high density memory device.

Figure 7:

In a specific embodiment, the method subjects the polysilicon gate structure to an oxidizing environment to form an oxide layer 704 as illustrated in a FIG. 7. The oxidizing environment causes a first silicon oxide layer 704 to form over a peripheral surface of the polysilicon gate. In an example embodiment, the first silicon oxide layer 704 includes an oxide polysilicon material that is doped with N-type impurities. The oxidizing environment also causes a second silicon oxide layer 708 to form on a surface region of the semiconductor substrate. As shown, a thin silicon oxide layer 708 is formed overlying the surface region of the semiconductor substrate. In an example embodiment, the silicon oxide layer 708 comprises an oxide formed with the doped (P-type) single silicon material. The height of the undercut regions 602 and 604 (FIG. 6) are then further reduced as shown in undercut 706. The first and second silicon oxide layers 704, 708 reduce the height of the undercut regions 602, 604. In an embodiment, the height of the undercut regions 706, 707 is about 30 angstroms to about 600 angstroms. Of course, there can be other variations, modifications, and alternatives.

Figure 8:
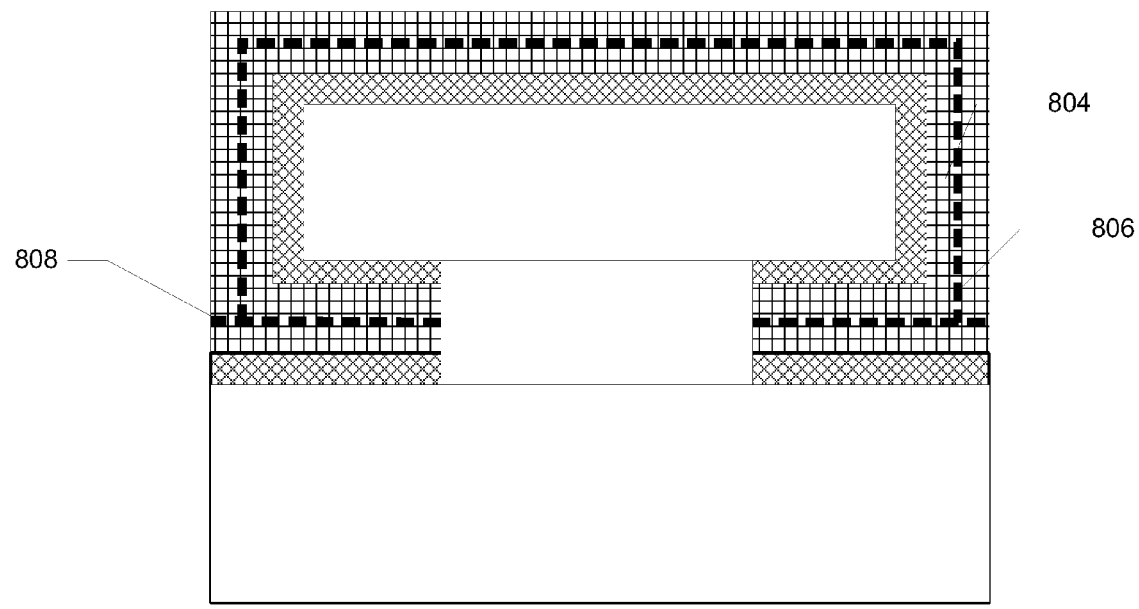

In a specific embodiment, the method forms a hafnium oxide material overlying the first silicon oxide layer and the second silicon oxide layer. The method also fills the reduced height undercut region 706, 707. In a specific embodiment, the hafnium oxide material includes a nanocrystalline silicon material sandwiched between hafnium oxide layers. A more detailed diagram of the hafnium oxide material is shown in FIG. 8. In an embodiment, the hafnium oxide material is formed by depositing a first hafnium oxide layer 804 overlying the first silicon oxide layer 704 of the polysilicon gate structure and the thin second silicon oxide layer 708. Depending on the applications, various types of deposition techniques, such as atomic layer deposition, may be used. As shown, the first hafnium oxide layer 804 fills the undercut region between the polysilicon gate and the semiconductor substrate. As shown in FIG. 8, the embodiment of the present invention provides that the thickness of the hafnium oxide material is controlled by the thickness of the gate oxide material.

The method then deposits a nanocrystalline silicon material 806 overlying the first hafnium oxide layer 804. The nanocrystalline silicon material can be deposited by a chemical vapor deposition process using a silicon chloride species as precursor. The silicon chloride species can include $SiH_2Cl_2$, $SiHCl_3$, or $SiCl_4$ depending on the embodiment. In an embodiment, the nanocrystalline silicon material is preferably deposited using a low pressure chemical vapor deposition process. As merely an example, the nanocrystalline silicon material can be deposited using 1% $SiH_2Cl_2$ in argon provided at a flow rate of about 50 SCCM at a pressure of about 0.1 torr and a temperature of about 800 degrees Celsius. In a specific embodiment, for a deposition time of about 20 minutes, a thickness of about 2 to 3.5 nm of nanocrystalline silicon material can be formed. Depending on the application, the thickness of the nanocrystalline silicon material may have other thickness.

Thereafter, a second hafnium oxide layer 808 is deposited overlying the nanocrystalline silicon material to complete the hafnium oxide material. As mentioned above, the nanocrystalline silicon material 806 is sandwiched between the first and second hafnium oxide layers. In a specific embodiment, the first hafnium oxide layer and the second hafnium layer may be formed using an atomic layer deposition process. In a specific embodiment, the first hafnium oxide layer and the second hafnium layer can have a hafnium to oxygen ratio of about 1:1.5 to about 1:2.5. In a specific embodiment, the nanocrystalline silicon material has charge trapping surfaces to receive and store charges injected into the nanocrystalline silicon material. Of course there can be other variations, modifications, and alternatives.

Figure 9:
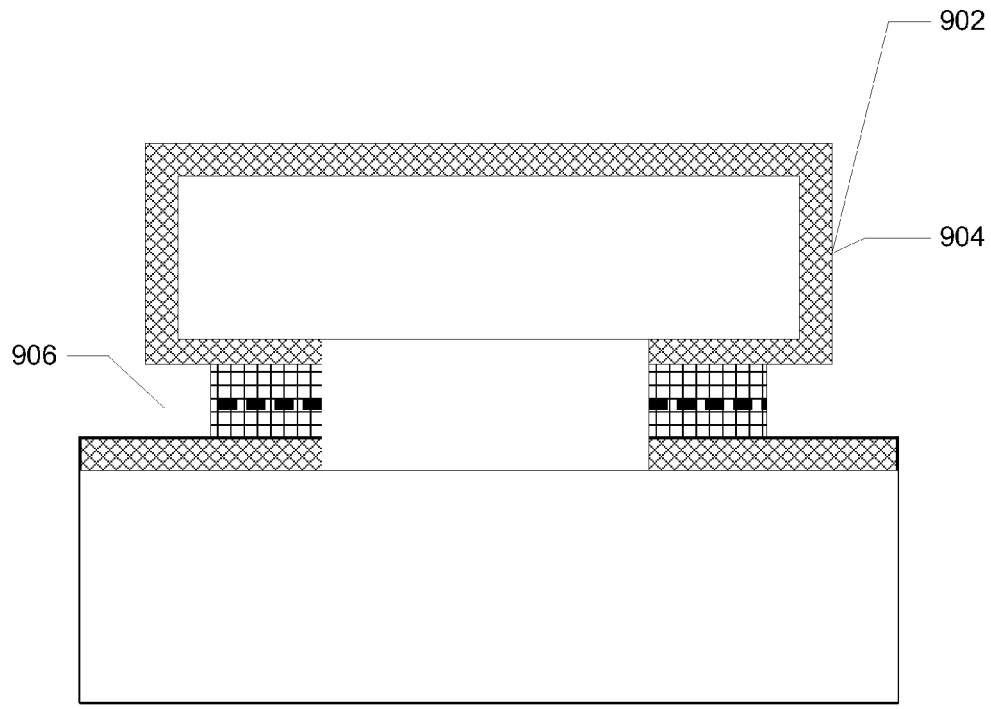

FIG. 9 is a simplified diagram exemplified an embodiment of the present invention. As shown, the method performs a selective etching process to remove a first portion of the hafnium oxide material from the gate structure while maintaining the hafnium oxide material in an insert region 904 within the undercut region. In a specific embodiment, reactive ion etching (RIE) process is used to remove a portion of the hafnium oxide material. For example, a void region 906 is formed after portions of the hafnium oxide material are removed with the RIE process. As an example, the device is placed in a vacuum chamber for the etching process. As shown in FIG. 9, the structure 902 can be used to provide the necessary alignment for the selective etching process. The hafnium oxide material in the insert region provides a double sided structure with a twin bit function for the memory device in a specific embodiment. For example, the hafnium oxide material on each side of the gate dielectric layer can be adapted to hold charges, thereby each can provide a memory bit. The hafnium material on each side of the gate dielectric layer is separated by an insulating layer (i.e., the gate dielectric layer), thereby preventing one charge from interfering with the other. Of course there can be other variations, modifications, and alternatives.

Figure 10:
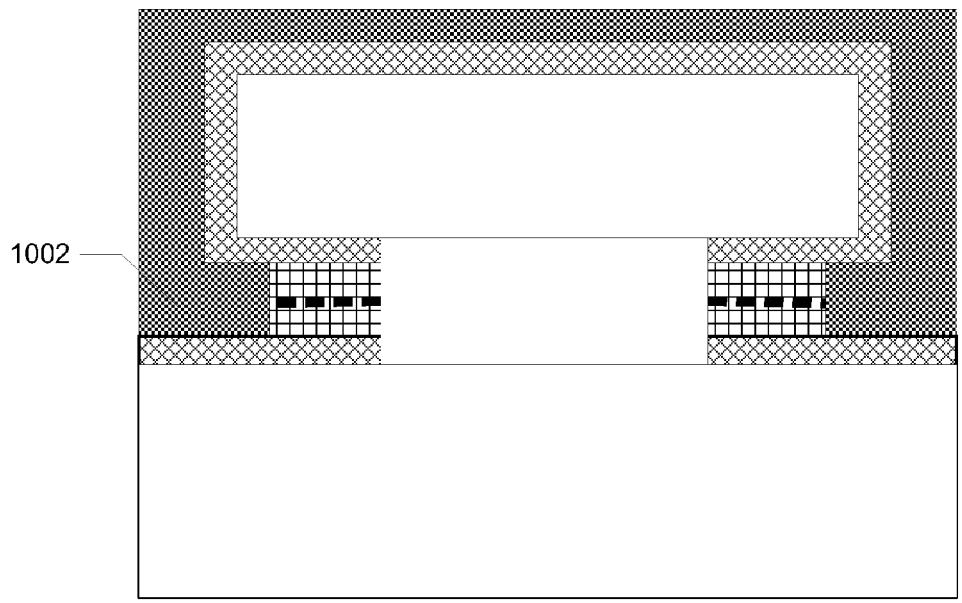

Referring to FIG. 10, the method includes forming a conformal dielectric layer 1002 overlying the polysilicon gate structure and exposed portions of the insert regions. The conformal dielectric layer may be a silicon oxide deposited using TEOS as a precursor in a specific embodiment. The conformal dielectric layer may also be a composite stack such as a silicon oxide on silicon nitride on silicon oxide (or commonly known as SONOS) depending on the embodiment.

Figure 11:
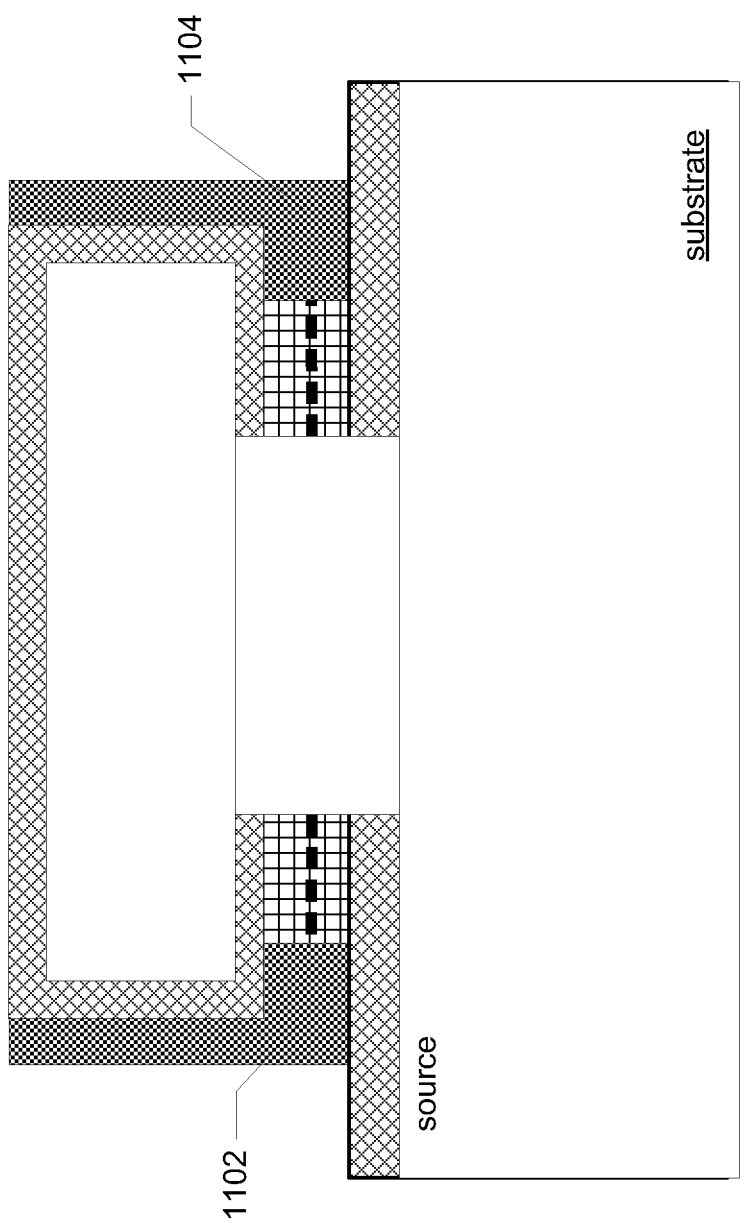

Referring to FIG. 11, the method includes performing a selective etching process to remove a portion of the dielectric layer 1002, thus forming sidewall spacer structures 1102, 1104 exposing the top portion of the polysilicon gate structure. The sidewall spacer structures 1102, 1104 are used to insulate the sides of the polysilicon gate structure and exposed portions of hafnium oxide material in the insert regions. The sidewall spacer structure isolate and protect the polysilicon gate structure in a specific embodiment.

It is to be appreciated that various steps and structures associated with the processed described above can be modified, added, removed, repeated, replaced, and/or overlapped. In a specific embodiment, an implantation process is performed to introduce As into an active region of the device. For example, As can be used to function as N-type dopant.

Figure 12:
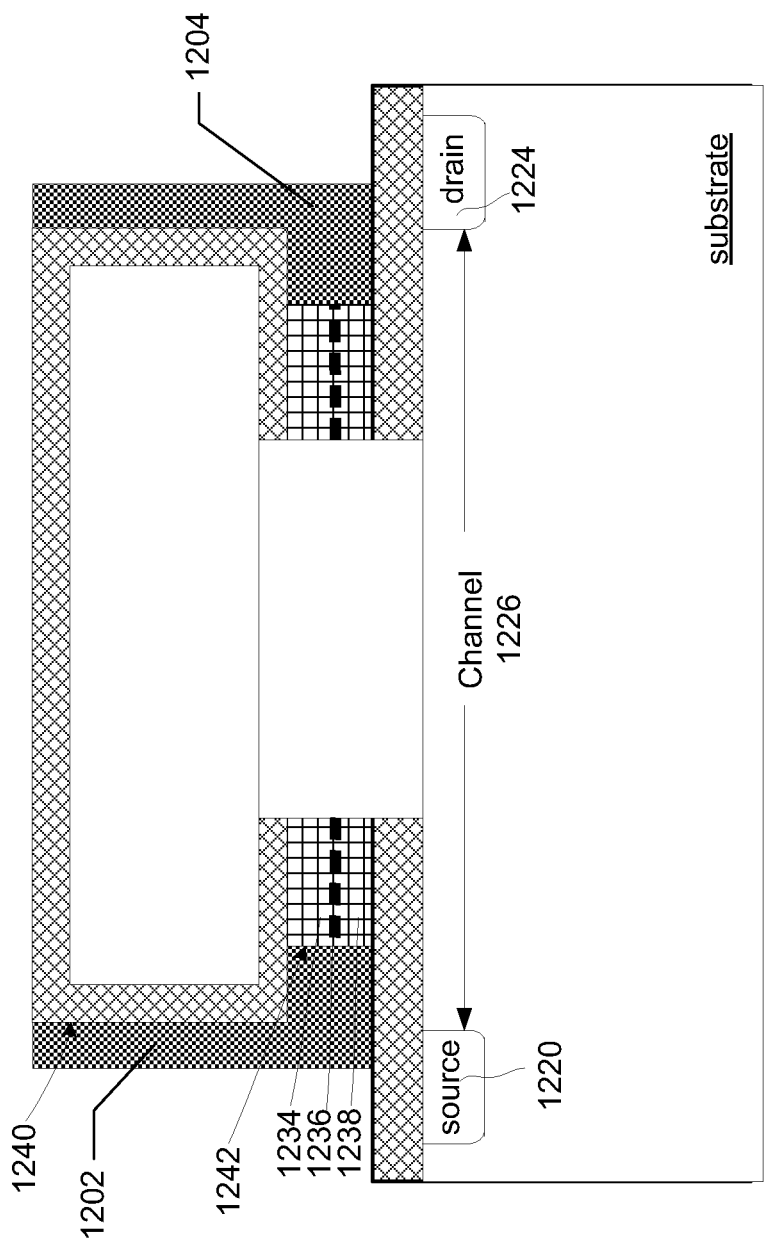
FIG. 12 is a simplified cross-sectional diagram illustrating a twin bit cell flash memory device according to an embodiment of the present invention.
Figure 13:
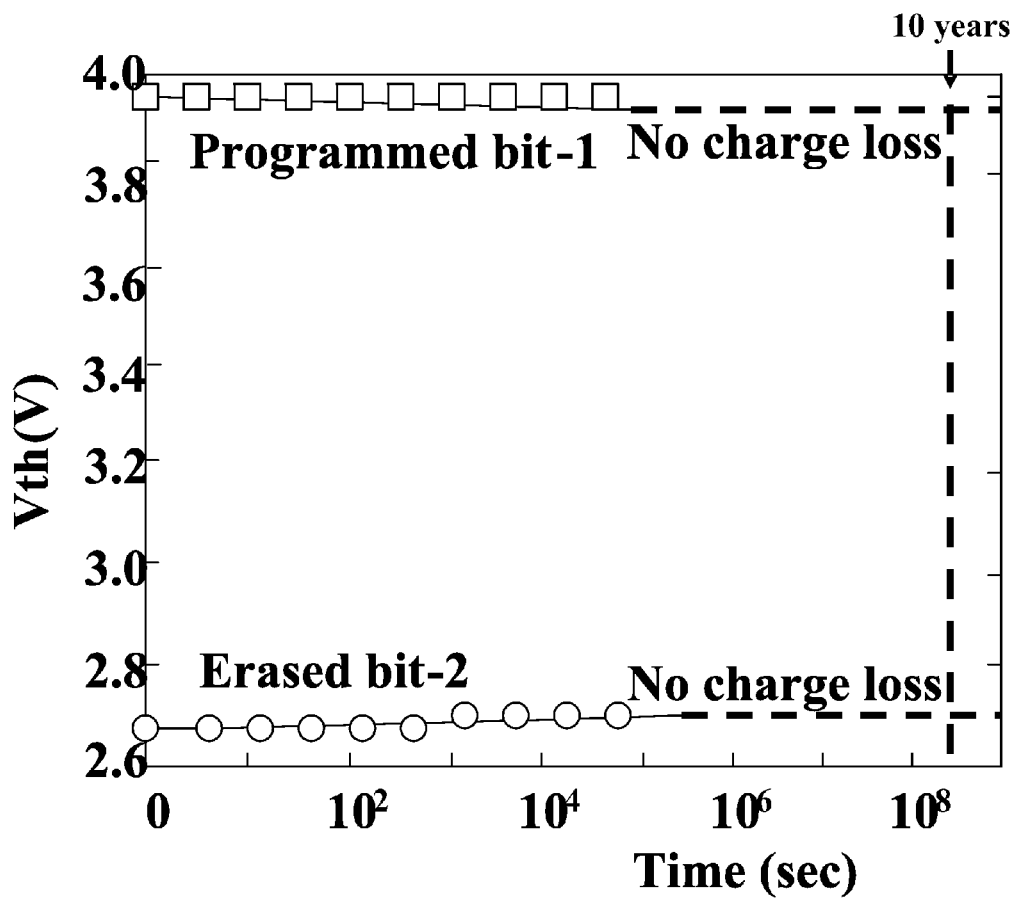
FIG. 13 is a simplified plot illustrating performance of the non-volatile memory device according to an embodiment of the present invention.

According to another embodiment, the present invention provides a non-volatile memory device. In an embodiment, the non-volatile memory device includes a semiconductor substrate including a surface region, a gate dielectric layer overlying the surface region, a polysilicon gate structure overlying the gate dielectric layer. The non-volatile memory device further includes a source 1220, a drain 1224, and a channel 1226 interposed between the source and the drain as shown in FIG. 12. In an embodiment, the source and drain is formed by an implantation process using an N-type impurity species such as arsenic (As), phosphorous (P), and the like. The non-volatile memory device also has a first undercut region underneath the polysilicon gate structure in a portion of the gate dielectric layer and a first silicon oxide layer covering an underside of the polysilicon gate structure facing the undercut region. Moreover, the non-volatile memory device also includes a hafnium oxide material in an insert region in a portion of the undercut region. The hafnium oxide material includes a nanocrystalline silicon material 1236 sandwiched between a first hafnium oxide layer 1234 and a second hafnium oxide layer 1238. Furthermore, a sidewall structure 1102 overlies a side region 1240 of the polysilicon gate structure and a side region 1242 of the hafnium oxide material.

In an embodiment of the non-volatile memory device, the first silicon oxide layer includes oxidized polysilicon material. In another embodiment, the first silicon oxide layer is formed by oxidizing the polysilicon gate structure. In another embodiment, the non-volatile memory device also includes a second silicon oxide layer overlying a surface region of the semiconductor substrate facing the undercut region. In another embodiment, the non-volatile memory device further includes a second undercut region at least partially filled with the hafnium oxide material. In yet another embodiment, the hafnium oxide material is characterized by a dielectric k value of about eight and greater. In another embodiment, the polysilicon gate structure is characterized by a width defined by the minimum geometry of a patterning process.

FIG. 12 is a simplified plot illustrating a retention characteristics of the twin bit memory device using hafnium oxide material according to an embodiment of the present invention. This plot is merely an example and should not unduly limit the claims herein. One skilled in the art would recognize other variations, modifications, and alternatives. As shown, a plot of threshold voltage (Vth) as a function of time is provided. The threshold voltage of a programmed bit is maintained at about 3.9 volts with no charge loss over a period of $10^8$ seconds (or approximately 10 years). The threshold voltage of an erased bit is maintained at a value of about 2.6 volts with no charge loss over the time period. The respective threshold voltages are measured at Vg=Vd=Vs=Vb=0. Of course there can be other modifications, variations, and alternatives.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for forming a non-volatile memory structure, the method comprising:
    providing a semiconductor substrate including a surface region;
    forming a gate dielectric layer overlying the surface region;
    forming a polysilicon gate structure overlying the gate dielectric layer;
    forming an undercut region underneath the polysilicon gate structure in a portion of the gate dielectric layer;
    subjecting the polysilicon gate structure to an oxidizing environment to cause formation of a first silicon oxide layer overlying an entire periphery of the polysilicon gate structure;
    depositing a hafnium oxide material overlying the first silicon oxide layer including filling the undercut region, the hafnium oxide material being formed by depositing a first hafnium oxide layer overlying the first silicon oxide layer, depositing a nanocrystalline silicon material overlying the first hafnium oxide layer and depositing a second hafnium oxide layer overlying the nanocrystalline silicon material;
    subjecting the hafnium oxide material to a selective etching process while maintaining the hafnium oxide material in an insert region in a portion of the undercut region and the first silicon oxide layer on the entire periphery of the polysilicon gate structure; and
    forming a sidewall structure overlying a side region of the polysilicon gate structure.

2. The method of claim 1 further comprising forming a source region and a drain region.

3. The method of claim 1, wherein the sidewall spacer structure is formed by depositing a conformal dielectric layer overlying the polysilicon gate structure followed by a selective etching process.

4. The method of claim 1 further comprising forming a second silicon oxide layer overlying a surface region of the semiconductor substrate facing the undercut region.

5. The method of claim 1, wherein the undercut region is formed using a self-limiting etching process.

6. The method of claim 1, wherein the undercut region is a void region.

7. The method of claim 1, wherein the nanocrystalline silicon has an outer surface, the outer surface being capable of accumulating electrical charge.

8. The method of claim 1, wherein the hafnium oxide material is a high k dielectric material.

9. The method of claim 1, wherein the first hafnium oxide layer and the second hafnium oxide layer are formed using atomic layer deposition.

10. The method of claim 9, wherein the first hafnium oxide layer and the second hafnium oxide layer each has a hafnium to oxygen ratio of about 1:1.5 to about 1:2.5.

11. The method of claim 1, wherein the insert regions provide a double-sided bit structure.

12. The method of claim 1, wherein the nanocrystalline silicon material has a thickness ranging from about 2 nm to about 4 nm.

13. The method of claim 1, wherein the hafnium oxide material is characterized by a first thickness, the first thickness being controlled by a thickness of the gate dielectric layer.

14. The method of claim 1 further comprises forming active regions in a vicinity of the surface region of the semiconductor substrate.

15. The method of claim 14, wherein the active regions are formed by an implantation process using a N type arsenic as an impurity species and the polysilicon gate structure, including the sidewall spacer as a mask.

16. The method of claim 1, wherein the selective etching process comprises a reactive ion etching process.

17. The method of claim 1, wherein maintaining the first silicon oxide layer on the entire periphery of the polysilicon gate structure comprises maintaining the first silicon oxide layer on the top surface of the polysilicon gate structure.

18. The method of claim 1, wherein depositing a nanocrystalline silicon material comprises using a silicon chloride species as a precursor.

19. The method of claim 18, wherein the nanocrystalline silicon material is deposited at a temperature of about 800 degrees Celsius and a time duration of about 20 minutes.

* * * * *